US008247088B2

(12) United States Patent
Ren et al.

(10) Patent No.: US 8,247,088 B2
(45) Date of Patent: Aug. 21, 2012

(54) EMITTING COMPLEX FOR ELECTROLUMINESCENT DEVICES

(75) Inventors: Xiaofan Ren, Rochester, NY (US); Joseph C. Deaton, Rochester, NY (US); David J. Giesen, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 900 days.

(21) Appl. No.: 12/200,163

(22) Filed: Aug. 28, 2008

(65) Prior Publication Data
US 2010/0052516 A1    Mar. 4, 2010

(51) Int. Cl.
*H01L 51/54* (2006.01)
*C09K 11/06* (2006.01)

(52) U.S. Cl. ........ 428/690; 428/917; 313/504; 313/506; 252/301.16; 257/40; 257/102; 257/E51.044; 548/103; 546/4

(58) Field of Classification Search .................. None
See application file for complete search history.

(56) References Cited

U.S. PATENT DOCUMENTS

| | | | |
|---|---|---|---|
| 3,172,862 A | 3/1965 | Gurnee et al. | |
| 3,173,050 A | 3/1965 | Gurnee et al. | |
| 3,180,730 A | 4/1965 | Klupfel et al. | |
| 3,567,450 A | 3/1971 | Brantly et al. | |
| 3,658,520 A | 4/1972 | Brantly et al. | |
| 3,710,167 A | 1/1973 | Dresner | |
| 4,356,429 A | 10/1982 | Tang | |
| 4,539,507 A | 9/1985 | Vanslyke et al. | |
| 4,720,432 A | 1/1988 | Vanslyke et al. | |
| 4,769,292 A | 9/1988 | Tang et al. | |
| 4,885,211 A | 12/1989 | Tang et al. | |
| 4,885,221 A | 12/1989 | Tsuneeda et al. | |
| 5,059,861 A | 10/1991 | Littman et al. | |
| 5,059,862 A | 10/1991 | VanSlyke et al. | |
| 5,061,569 A | 10/1991 | Vanslyke et al. | |
| 5,121,029 A | 6/1992 | Hosokawa et al. | |
| 5,141,671 A | 8/1992 | Bryan et al. | |
| 5,150,006 A | 9/1992 | Van Slyke et al. | |
| 5,151,629 A | 9/1992 | Van Slyke et al. | |
| 5,247,190 A | 9/1993 | Friend et al. | |
| 5,276,380 A | 1/1994 | Tang | |
| 5,283,182 A | 2/1994 | Powell et al. | |
| 5,294,870 A | 3/1994 | Tang et al. | |
| 5,405,709 A | 4/1995 | Littman et al. | |
| 5,484,922 A | 1/1996 | Moore et al. | |
| 5,503,910 A | 4/1996 | Matsuura et al. | |
| 5,552,678 A | 9/1996 | Tang et al. | |
| 5,593,788 A | 1/1997 | Shi et al. | |
| 5,608,287 A | 3/1997 | Hung et al. | |
| 5,645,948 A | 7/1997 | Shi et al. | |
| 5,677,572 A | 10/1997 | Hung et al. | |
| 5,683,823 A | 11/1997 | Shi et al. | |
| 5,688,551 A | 11/1997 | Littman et al. | |
| 5,703,436 A | 12/1997 | Forrest et al. | |
| 5,714,838 A | 2/1998 | Haight et al. | |
| 5,739,545 A | 4/1998 | Guha et al. | |
| 5,755,999 A | 5/1998 | Shi et al. | |
| 5,776,622 A | 7/1998 | Hung et al. | |
| 5,776,623 A | 7/1998 | Hung et al. | |
| 5,837,391 A | 11/1998 | Utsugi | |
| 5,851,709 A | 12/1998 | Grande et al. | |
| 5,928,802 A | 7/1999 | Shi et al. | |
| 5,935,720 A | 8/1999 | Chen et al. | |
| 5,935,721 A | 8/1999 | Shi et al. | |
| 5,969,474 A | 10/1999 | Arai | |
| 5,981,306 A | 11/1999 | Burrows et al. | |
| 6,020,078 A | 2/2000 | Chen et al. | |
| 6,066,357 A | 5/2000 | Tang et al. | |
| 6,097,147 A | 8/2000 | Baldo et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,226,890 B1 | 5/2001 | Boroson et al. | |
| 6,237,529 B1 | 5/2001 | Spahn | |
| 6,239,085 B1 | 5/2001 | Slack | |
| 6,278,236 B1 | 8/2001 | Madathil et al. | |
| 6,337,492 B1 | 1/2002 | Jones et al. | |
| 6,413,656 B1 | 7/2002 | Thompson et al. | |
| 6,451,415 B1 | 9/2002 | Forrest et al. | |
| 6,451,455 B1 | 9/2002 | Thompson et al. | |
| 6,458,475 B1 | 10/2002 | Adachi et al. | |
| 6,515,298 B2 | 2/2003 | Forrest et al. | |
| 6,573,651 B2 | 6/2003 | Adachi et al. | |

(Continued)

FOREIGN PATENT DOCUMENTS

EP    0 732 868    9/1996

(Continued)

OTHER PUBLICATIONS

Lamansky et al. "Synthesis and characterization of phosphorescent cyclometalated iridium complexes." Inorg. Chem. vol. 40, No. 7, 2001. pp. 1704-1711.*

English language machine translation of JP 2003-272861 A, 2003.*

Xie et al., "2-Aminopyrimidine-4,6-diol as an Efficient Ligand for Solvent-Free Copper-Catalyzed N-Arylations of Imidazoles with Aryl and Heteroaryl Halides", J. Org. Chem., vol. 71.

Dresner, Double Injection Electroluminescence in Anthracene, RCA Review, vol. 30, pp. 322-334, 1969.

Tang et al, Electroluminescence of doped organic thin films, J. Appl. Physics, vol. 65, pp. 3610-3616, 1989.

King et al, Excited State Properties of a Triply Ortho-Metalated Iridium(III) Complex, J. Am. Chem. Soc. 107, 1431, 1985.

(Continued)

*Primary Examiner* — Jennifer Chriss
*Assistant Examiner* — Michael H Wilson
(74) *Attorney, Agent, or Firm* — McKenna Long & Aldridge LLP

(57) ABSTRACT

An OLED device including a cathode, an anode, and having therebetween a phosphorescent light-emitting layer that contains a light-emitting organometallic complex including a precious metal, a first ligand including an imidazole group and a second nitrogen heterocycle group, and at least one second different ligand.

12 Claims, 4 Drawing Sheets

U.S. PATENT DOCUMENTS

| | | |
|---|---|---|
| 2002/0015859 A1 | 2/2002 | Watanabe et al. |
| 2002/0025419 A1 | 2/2002 | Lee et al. |
| 2002/0100906 A1 | 8/2002 | Takiguchi et al. |
| 2002/0121638 A1 | 9/2002 | Grushin et al. |
| 2002/0134984 A1 | 9/2002 | Igarashi |
| 2002/0197511 A1 | 12/2002 | D'Andrade et al. |
| 2003/0017361 A1 | 1/2003 | Thompson et al. |
| 2003/0040627 A1 | 2/2003 | Fujii |
| 2003/0054198 A1 | 3/2003 | Tsuboyama et al. |
| 2003/0059646 A1 | 3/2003 | Kamatani et al. |
| 2003/0068526 A1 | 4/2003 | Kamatani et al. |
| 2003/0068528 A1 | 4/2003 | Thompson et al. |
| 2003/0068535 A1 | 4/2003 | Takiguchi et al. |
| 2003/0072964 A1 | 4/2003 | Kwong et al. |
| 2003/0124381 A1 | 7/2003 | Thompson et al. |
| 2003/0141809 A1 | 7/2003 | Furugori et al. |
| 2003/0175553 A1 | 9/2003 | Thompson et al. |
| 2004/0065544 A1* | 4/2004 | Igarashi et al. ............ 204/296 |
| 2004/0068132 A1 | 4/2004 | Lecloux et al. |
| 2004/0086742 A1* | 5/2004 | Ma et al. ............... 428/690 |
| 2005/0064238 A1* | 3/2005 | Lee et al. ............... 428/690 |
| 2005/0260446 A1* | 11/2005 | Mackenzie et al. ......... 428/690 |
| 2006/0255332 A1* | 11/2006 | Becker et al. ............. 257/40 |
| 2006/0269784 A1 | 11/2006 | Ren et al. |
| 2007/0087219 A1 | 4/2007 | Ren et al. |

FOREIGN PATENT DOCUMENTS

| | | |
|---|---|---|
| EP | 0 891 121 | 1/1999 |
| EP | 1 009 041 | 6/2000 |
| EP | 1 029 909 | 8/2000 |
| EP | 1 076 368 | 2/2001 |
| EP | 1 182 244 | 2/2002 |
| EP | 1 187 235 | 3/2002 |
| EP | 1239526 | 9/2002 |
| EP | 1244155 | 9/2002 |
| EP | 1238981 | 6/2005 |
| JP | 2003-059667 | 2/2003 |
| JP | 2003-073387 | 3/2003 |
| JP | 2003-073388 | 3/2003 |
| JP | 2003-073665 | 3/2003 |
| JP | 2003-272861 | 9/2003 |
| JP | 2003-317965 | 11/2003 |
| JP | 2004-204140 | 7/2004 |
| WO | WO 98/55561 | 12/1998 |
| WO | WO 00/18851 | 4/2000 |
| WO | WO 00/57676 | 9/2000 |
| WO | 00/70655 | 11/2000 |
| WO | WO 00/70655 | 11/2000 |
| WO | 01/39234 | 5/2001 |
| WO | 01/41512 | 6/2001 |
| WO | 01/93642 | 12/2001 |
| WO | WO 01/93642 | 12/2001 |
| WO | 02/15645 | 2/2002 |
| WO | 02/071813 | 9/2002 |
| WO | 02/074015 | 9/2002 |

OTHER PUBLICATIONS

Colombo et al, Facial Tris Cyclometalated Rh3+ and Ir3+ Complexes: Their Synthesis, Structure and Optical Spectroscopic Properties, Inorg. Chem. 33, 545, 1994.

Adachi et al, High-efficiency red electrophosphorence devices, App. Phys. Lett, 78, 1622-1624, 2001.

Baldo et al, Very high efficiency green organic light-emitting devices based on electrophosphorescence, Appl. Phys. Lett. 75, 4, 1999.

Tsutsui et al, High Quantum Efficiency in Organic Light-Emitting Devices With Iridium-Complex as a Triplet Emissive Center, Jpn. J. Appl. Phys. 38, L1502, 1999.

Adachi et al, High-efficiency organic electrophosphorescent devices with tris(2-phenylpridine) iridium doped into electron-transporting materials, Appl. Phys. Lett. 77, 904, 2000.

Ma et al, Triplet luminescent dinuclear-gold(I) complex-based light-emitting diodes with low turn-on voltage, Appl. Phys. Lett. 74, 1361, 1998.

Kido et al, Bright red emitting organic electroluminescent devices having a europium complex as an emitter, Appl. Phys. Lett. 65, 2124, 1994.

Yang et al, Use of Poly(9-vinylcarbazole) as Host Material for Iridium Complexes in High-Efficiency Organic Light-Emitting Devices, Jpn J. Appl. Phys. 39, L828, 2000.

D'Andrade et al, Efficient White Phosphorescent Organic Light-Emitting Devices, SID Symposium Digest, vol. 38, pp. 1026-1029, 2007.

Li et al, Synthetic Control of Excited-State Properties in Cyclometalated Ir(III) Complexes Using Ancillary Ligands, Inorg. Chem. vol. 44, pp. 1713-1727 2005.

Tamayo et al, Synthesis and Characterization of Facial and Meridional Tris-cyclometalated Iridum(III) Complexes, J. Am. Chem. Soc., 125, 7377, 2003.

* cited by examiner

EMITTING COMPLEX FOR ELECTROLUMINESCENT DEVICES

CROSS REFERENCE TO RELATED APPLICATIONS

Reference is made to commonly assigned U.S. patent application Ser. No. 11/141,092 filed May 31, 2005, (now U.S. Patent Application Publication No. 2006/0269784) entitled "Light-Emitting Device Containing Bis-Phosphineoxide Compounds" by Ren; U.S. patent application Ser. No. 11/254,108 filed Oct. 19, 2005 (now U.S. Patent Application Publication No. 2007/0087219), entitled "Electroluminescent Device" by Ren et al.; the disclosures of which are incorporated herein by reference.

FIELD OF THE INVENTION

The present invention relates to an organic light emitting diode (OLED) electroluminescent (EL) device including a light-emitting layer containing an organometallic complex that can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device includes an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons, and referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material. Still further, there has been proposed in U.S. Pat. No. 4,769,292 a four-layer EL element including a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of a light-emitting dopant. However, it is generally believed that only 25% of the excitons created in an EL device are singlet excitons. The remaining excitons are triplet, which cannot readily transfer their energy to the singlet excited state of a dopant. This results in a large loss in efficiency since 75% of the excitons are not used in the light emission process.

Triplet excitons can transfer their energy to a dopant that has a triplet excited state that is low enough in energy. If the triplet state of the dopant is emissive it can produce light by phosphorescence. In many cases, singlet excitons can also transfer their energy to the lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

Fac-Tris(2-Phenylpyridinato-N,$C^{2'}$)Iridium(III) (Ir(ppy)$_3$) strongly emits green light from a triplet excited state owing to the large spin-orbit coupling of the heavy atom and to the lowest excited state, which is a charge transfer state having a Laporte allowed (orbital symmetry) transition to the ground state (K. A. King, P. J. Spellane, and R. J. Watts, *J. Am. Chem. Soc.*, 107, 1431 (1985), M. G. Colombo, T. C. Brunold, T. Reidener, H. U. Gudel, M. Fortsch, and H.-B. Burgi, *Inorg. Chem.*, 33, 545 (1994)). It is reported that, when used as a dopant in a EL device, this material affords an internal quantum efficiency of greater than 85%. This high efficiency can result from collecting energy from both the singlet and triplet excited states of the host (3-phenyl-4-(1'-naphthyl)-5-phenyl-1,2,4-triazole (TAZ) was the host material). Highly efficient red electrophosphorescence has also been reported, using bis(2-(2'-benzo[4,5-a]thienyl)pyridinato-N,$C^3$)iridium (acetylacetonate) [Btp$_2$Ir(acac)] as the dopant (Adachi, C., Lamansky, S., Baldo, M. A., Kwong, R. C., Thompson, M. E., and Forrest, S. R., *App. Phys. Lett.*, 78, 1622-1624 (2001)).

Small-molecule, vacuum-deposited OLEDs having high efficiency have also been demonstrated with Ir(ppy)$_3$ as the dopant and 4,4'-N,N'-dicarbazole-biphenyl (CBP) as the host (M. A. Baldo, S. Lamansky, P. E. Burrows, M. E. Thompson, S. R. Forrest, *Appl. Phys. Lett.*, 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.*, 38, L1502 (1999)). The layer containing the dopant and host was deposited adjacent to a hole-blocking layer, 2,9-dimethyl-4,7-diphenyl-phenanthroline (bathocuproine, BCP). Other device structures for generating electrophosphorescence have also been documented, for example see C. Adachi, M. A. Baldo, S. R. Forrest, and M. E. Thompson, *Appl. Phys. Lett.*, 77, 904 (2000).

The emission wavelengths of cyclometallated Ir(III) complexes of the type IrL$_3$ and IrL$_2$L', such as the green-emitting fac-tris(2-phenylpyridinato-N,$C^{2'}$)Iridium(III) and bis(2-phenylpyridinato-N,$C^{2'}$)Iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N,C$^{3'}$)Iridium(III)(acetylacetonate) and tris(2-phenylisoquinolinato-N,C$^{8'}$)Iridium(III). A blue-emitting example is bis(2-(4',6'-diflourophenyl)-pyridinato-N,C$^{2'}$)Iridium(III)(picolinate).

Other important phosphorescent dopants include cyclometallated Pt(II) complexes such as cis-bis(2-phenylpyridinato-N,C$^{2'}$)platinum(II), cis-bis(2-(2'-thienyl)pyridinato-N,C$^{3'}$)platinum(II), cis-bis(2-(2'-thienyl)quinolinato-N,C$^{5'}$)platinum(II), or (2-(4,6-diflourophenyl)pyridinato-N,C$^{2'}$)platinum (II) acetylacetonate. Pt(II) porphyrin complexes such as 2,3,7,8,12,13,17,18-octaethyl-21H, 23H-porphine platinum(II) are also useful phosphorescent dopants.

Without being limited to a particular theory, phosphorescence can be found among transition metal ion octahedral complexes having d$^6$ electron configuration and square planar complexes having d$^8$ electron configuration, each also having as the lowest-energy excited state a metal-to-ligand charge transfer transition or a ligand pi-pi* transition that is capable of mixing with a nearby metal-to-ligand charge transfer. Suitable transition metal ions for phosphorescent complexes include preferably the second or third transition series, or more preferably the third transition series (Hf, Nb, W, Re, Os, Ir, Pt, Au).

Other examples of phosphorescent compounds include compounds having interactions between atoms having d$^{10}$ electron configuration, such as Au$_2$(dppm)Cl$_2$ (dppm=bis(diphenylphosphino)methane) (Y. Ma et al, *Appl Phys. Lett.*, 74, 1361 (1998)). Still other examples of phosphorescent dopants include coordination complexes of the trivalent lanthanides such as Tb$^{3-}$ and Eu$^{3+}$ (J. Kido et al, *Appl. Phys. Lett.*, 65, 2124 (1994)). While these latter dopants do not have triplets as the lowest excited states, their optical transitions do involve a change in spin state of 1 and thereby can harvest the triplet excitons in OLED devices.

Phosphorescent dopants are also described in WO 00/57676, WO 00/70655, WO 01/41512 A1, WO 02/15645 A1, WO 01/93642 A1, WO 01/39234 A2, WO 02/071813 A1, EP 1 239 526 A2, EP 1 238 981 A2, EP 1 244 155 A2, WO 02/074015 A2, JP 2003 073387A, JP 2003 073388A, JP 2003 059667A, JP 2003 073665A, U.S. Pat. Nos. 6,458,475 B1; 6,451,455 B1; 6,239,085 B1; 6,413,656 B1; 6,515,298 B2; 6,451,415 B1; 6,097,147; 6,573,651 B2; U.S. Patent Application Publication Nos. 2002/0197511 A1; 2003/0124381 A1; 2003/0072964 A1; 2003/0068528 A1; 2003/0059646 A1; 2003/0054198 A1; 2003/0017361 A1; 2002/0100906 A1; 2003/0068526 A1; 2003/0068535 A1; 2003/0141809 A1; 2003/0040627 A1; 2002/0121638 A1, and 2002/0121638 A1.

In a similar fashion, high efficiency polymer OLEDs containing phosphorescent dopants, such as Ir(ppy)$_3$, have also been reported, for example, see M.-J. Yang and T. Tsutsui, *Jpn. J. Appl. Phys.*, 39, L828 (2000).

Suitable host molecules for phosphorescent dopants must have the energy of their triplet states about equal to or above that of the phosphorescent dopant in order that the triplet exciton can be transferred efficiently from the host to the phosphorescent dopant. However, the band gap of the host should not be chosen so large as to cause an unacceptable increase in the drive voltage of the OLED. Suitable host types are described in WO 00/70655 A2; WO 01/39234 A2; WO 01/93642 A1; WO 02/074015 A2; and WO 02/15645 A1. Suitable hosts include certain aryl amines and carbazole compounds.

In addition to suitable hosts, an OLED device employing a phosphorescent dopant often requires at least one exciton- or hole-blocking layer to help confine the excitons or electron-hole recombination centers to the light-emitting layer including the host and dopant. In one embodiment, such a blocking layer would be placed between the electron-transporting layer and the light-emitting layer. In this case, the ionization potential of the blocking layer should be such that there is an energy barrier for hole migration from the host into the electron-transporting layer, while the electron affinity should be such that electrons pass more readily from the electron-transporting layer into the light-emitting layer including host and dopant. It is further desired, but not absolutely required, that the triplet energy of the blocking material be greater than that of the phosphorescent dopant. Suitable hole-blocking materials are described in WO 00/70655 A2 and WO 01/93642 A1. Two examples of useful materials are bathocuproine (BCP) and bis(2-methyl-8-quinolinolato)(4-phenylphenolato)Aluminum(III) (BAlQ).

Notwithstanding these developments, there remains a need for new organometallic materials that will function as phosphorescent emitters, especially in the blue-emitting region. To date, most of the phosphorescent complexes developed for OLED applications have emission spectra with peaks in the red and green region. U.S. Patent Application Publications Nos. 2002/0134984A1 and 2004/0068132A1 also disclose iridium complexes that emit in the blue region, even though the colors are not saturated. Recently, B. W. D'Andrade, J.-Y Tsai, C. Lin, M. S. Weaver, P. B. Mackenzie, J. Brown, "Efficient White Phosphorescent Organic Light-Emitting Devices," SID Symposium Digest, Vol. 38, pp. 1026-1029, 2007 have reported a sky-blue phosphorescent OLED with an operational lifetime of 15,000 hr. at an initial brightness of 200 cd/m$^2$ and 9.5% external quantum efficiency. However, with CIE coordinates of (0.16, 0.37), this material is not a sufficiently saturated blue for commercial full-color applications. Research on higher triplet-energy emitters has been reported. These emitters are often iridium complexes that have two cyclometalated (C^N) ligands and one bidentate ancillary ligand (N^N) (J. Li, P. I. Djurovich, B. D. Alleyne, M. Yousufuddin, N. N. Ho, J. C. Thomas, J. C. Peters, R. Bau, M. E. Thompson, "Synthetic Control of Excited-State Properties in Cyclometalated Ir(III) Complexes Using Ancillary Ligands," Inorg. Chem., Vol. 44, pp. 1713-1727, 2005). The (N^N) ancillary ligands are believed to render these blue phosphors unstable in devices. To date, the design and synthesis of efficient "deep blue" phosphorescent emitters remains one of the most challenging tasks in the OLED community.

Therefore, there remains a need for new efficient phosphorescent materials, particularly materials that produce their emission in the blue region of the visible spectrum. It is a problem to be solved to provide new blue phosphorescent emitting materials that can function under practical operating conditions in an OLED device. Desirably, such a material can be developed to improve on device efficiency and operational stability.

SUMMARY OF THE INVENTION

There is a need for new phosphorescent emitting materials useful in an OLED device.

This object is achieved by an OLED device comprising a cathode, an anode, and having therebetween a phosphorescent light-emitting layer that contains a light-emitting organometallic complex comprising a precious metal, a first ligand comprising an imidazole group and a second nitrogen heterocycle group, and at least one second different ligand.

This object is also achieved by an OLED device comprising a cathode, an anode, and having therebetween a phosphorescent light-emitting layer that contains a light-emitting homoleptic tris organometallic complex comprising iridium and a C,N-cyclometallating ligand comprising an imidazole group and a second nitrogen heterocycle group, wherein the organometallic complex has a facial orientation and an emission maximum at a wavelength shorter than 480 nm.

It is an advantage of this invention that it provides a blue emitter with improved color and high efficiency for an OLED device.

DETAILED DESCRIPTION OF THE INVENTION

Figure 1:
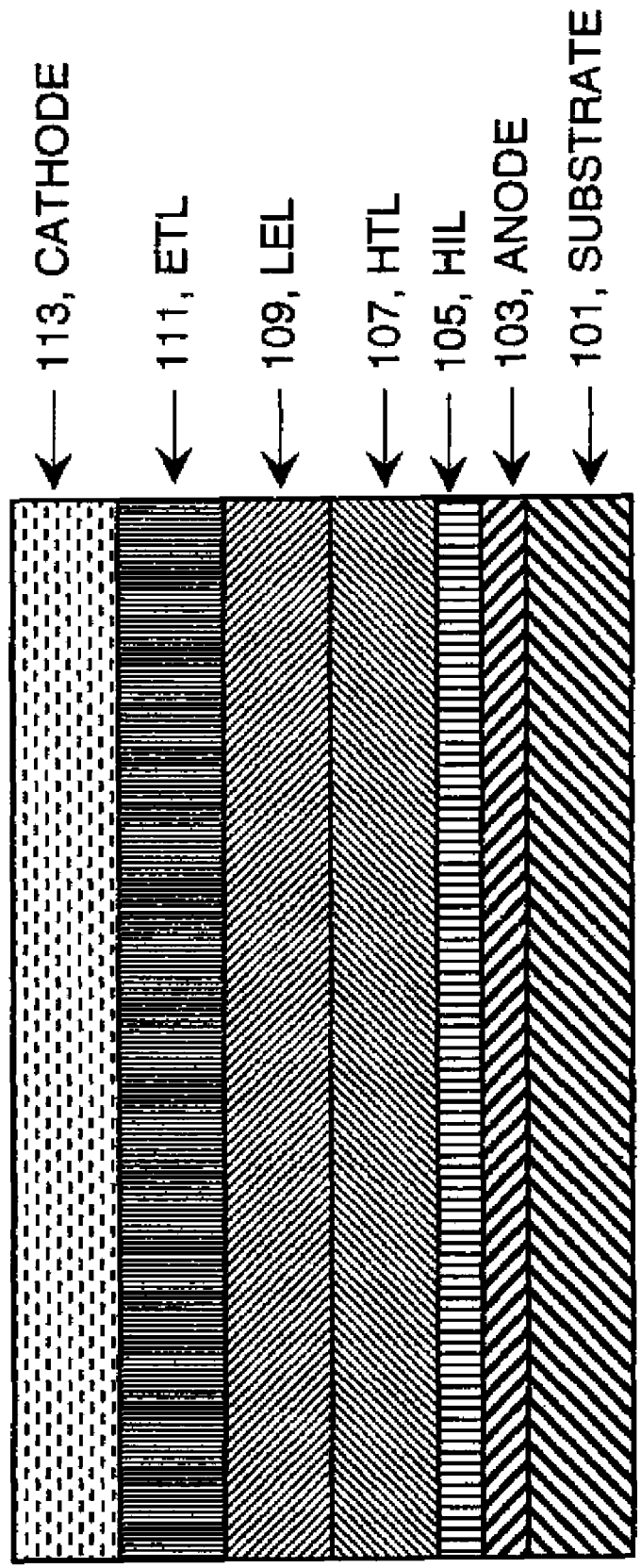
FIG. 1 shows a cross-section of a typical OLED device in which this invention can be used.

In one embodiment, this invention includes an OLED device including a cathode, an anode, and having therebetween a phosphorescent light-emitting layer that contains a light-emitting organometallic complex including a precious metal, a first ligand including an imidazole group and a second nitrogen heterocycle group, and at least one second different ligand. A first ligand that is useful for the practice of this invention includes an imidazole group, that is, a five-membered unsaturated ring containing two nitrogen atoms in the 1 and 3 positions, and a second nitrogen heterocycle group attached to the imidazole ring at the 1-position of the imidazole ring. It is desirable, but not necessary, that the imidazole ring system be further substituted with substituents at the 4 and 5 positions. Usefully, the substituents can form a ring group, and desirably the ring group is a five or six-membered aromatic ring. Other substituents can be used on the ring group, or the second heterocycle group, or both. Illustrative examples of useful ligands are shown below.

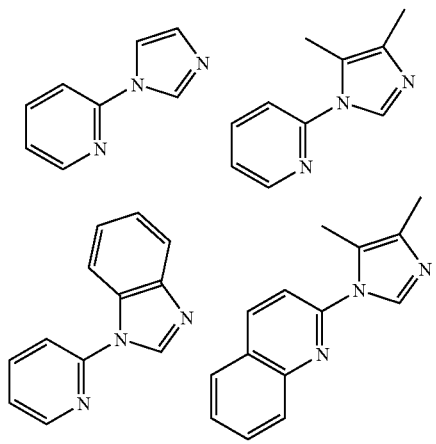

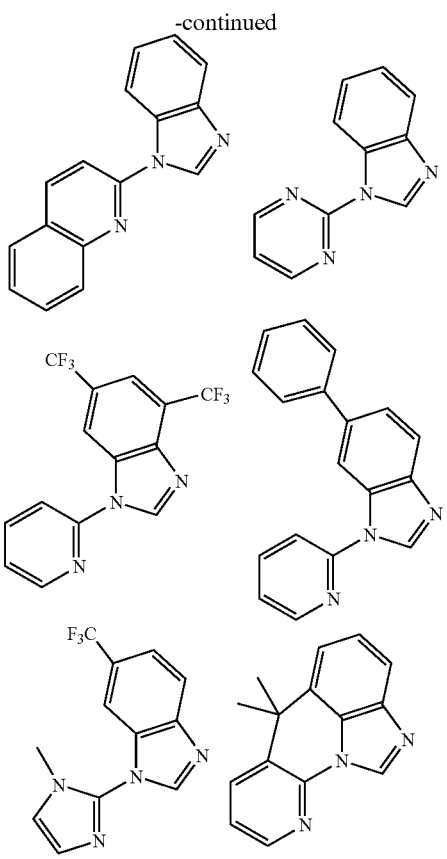

An OLED device can be constructed including a cathode, an anode, and having therebetween a phosphorescent light-emitting layer that contains a light-emitting organometallic complex including a precious metal, a first ligand as described above, and at least one second different ligand. The light-emitting organometallic complex can be represented by certain embodiments, which will be further described, of Formula (1),

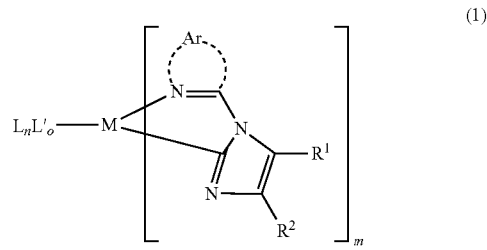

wherein:
M is a 4- or 6-coordinate precious metal;
$R^1$ and $R^2$ represent independently selected substituent groups, provided that $R^1$ and $R^2$ can form a ring group;
Ar represents the groups necessary to complete a substituted or unsubstituted aromatic group that forms the second nitrogen heterocycle group;
L and L' are different second ligands; and
$m+n+o=2$ for a 4-coordinate metal and 3 for a 6-coordinate metal, provided that $m>0$ and at least one of n and o are greater than zero.

Examples of independently selected substituent groups $R^1$ and $R^2$ include phenyl, tolyl, and alkyl such as methyl and ethyl. In one desirable embodiment $R^1$ and $R^2$ form a ring group, desirably an aromatic ring, such as a substituted or unsubstituted benzene ring group. Illustrative examples of $R^1$ and $R^2$ are shown below.

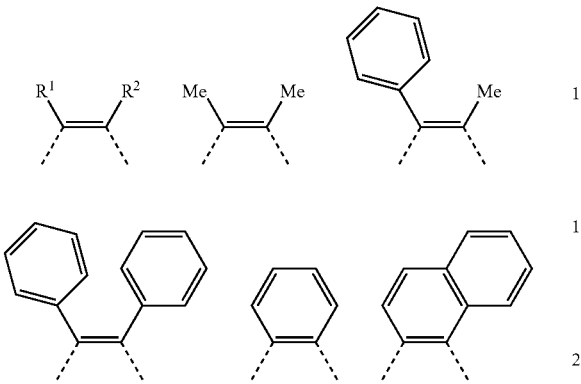

M is a coordinated precious metal selected from the group consisting of Ir, Rh, Ru, Pt, Pd, and Os. In one suitable embodiment, M represents Ir or Rh, and more desirably M represents Ir. m is 1 or 2 and m+n+o is 3 when M is Ir, Ru, or Rh, and m is 1 and m+n+o is 2 when M is Pt or Pd.

Desirably, L and L' represent bidentate ligands. For example, L and L' can represent carbonyl-substituted groups such as an acetylacetonate group, a hexafluoroacetylacetonate group, or a salicylaldehyde group. L and L' can also represent acid derivatives of formula $R^aCO_2^-$, wherein $R^a$ can be substituted or unsubstituted aryl, such as phenyl or tolyl, or substituted or unsubstituted alkyl, such as methyl or butyl. Examples of desirable bidentate acid derivatives are picolinic acid and 3-bromopicolinic acid. L and L' can also represent substituted or unsubstituted phenylpyridyl ligands. In one useful embodiment, at least one of L and L' is a C,N-cyclometallating ligand. One such useful C,N-cyclometalating ligand is a phenylpyridyl ligand. In one such embodiment, the organometallic complex has the structure of Formula (2):

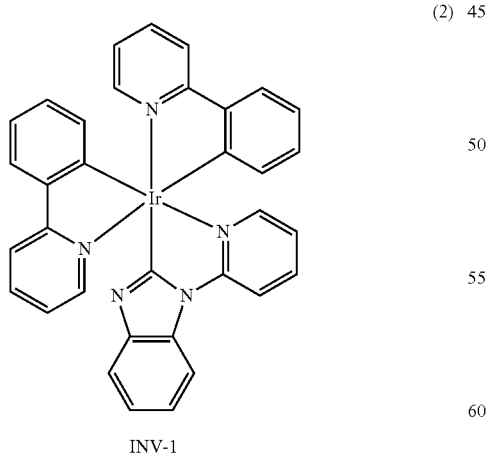

(2)

INV-1

In another useful embodiment, the least one C,N-cyclometallating ligand is a difluorophenylpyridyl ligand. In one such embodiment, the organometallic complex has the structure of Formula (3):

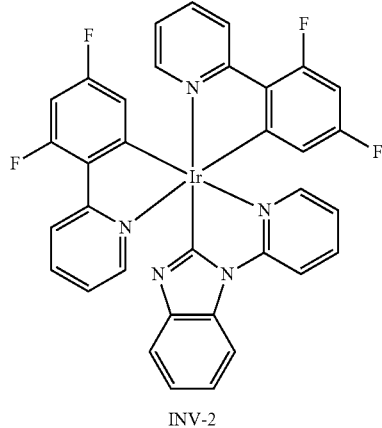

(3)

INV-2

Other useful organometallic complex compounds of this invention include:

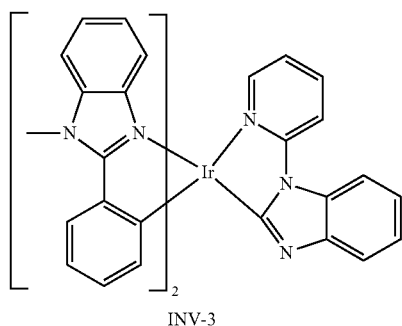

INV-3

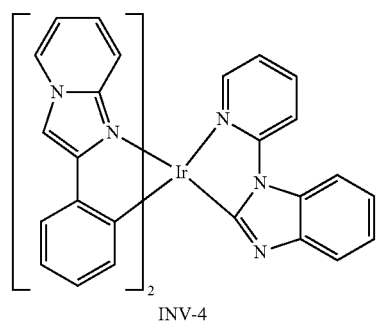

INV-4

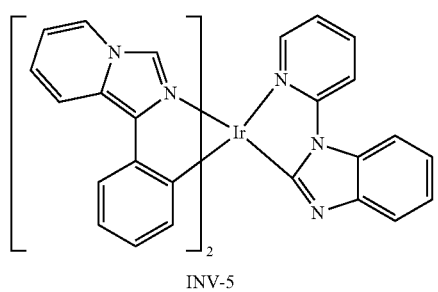

INV-5

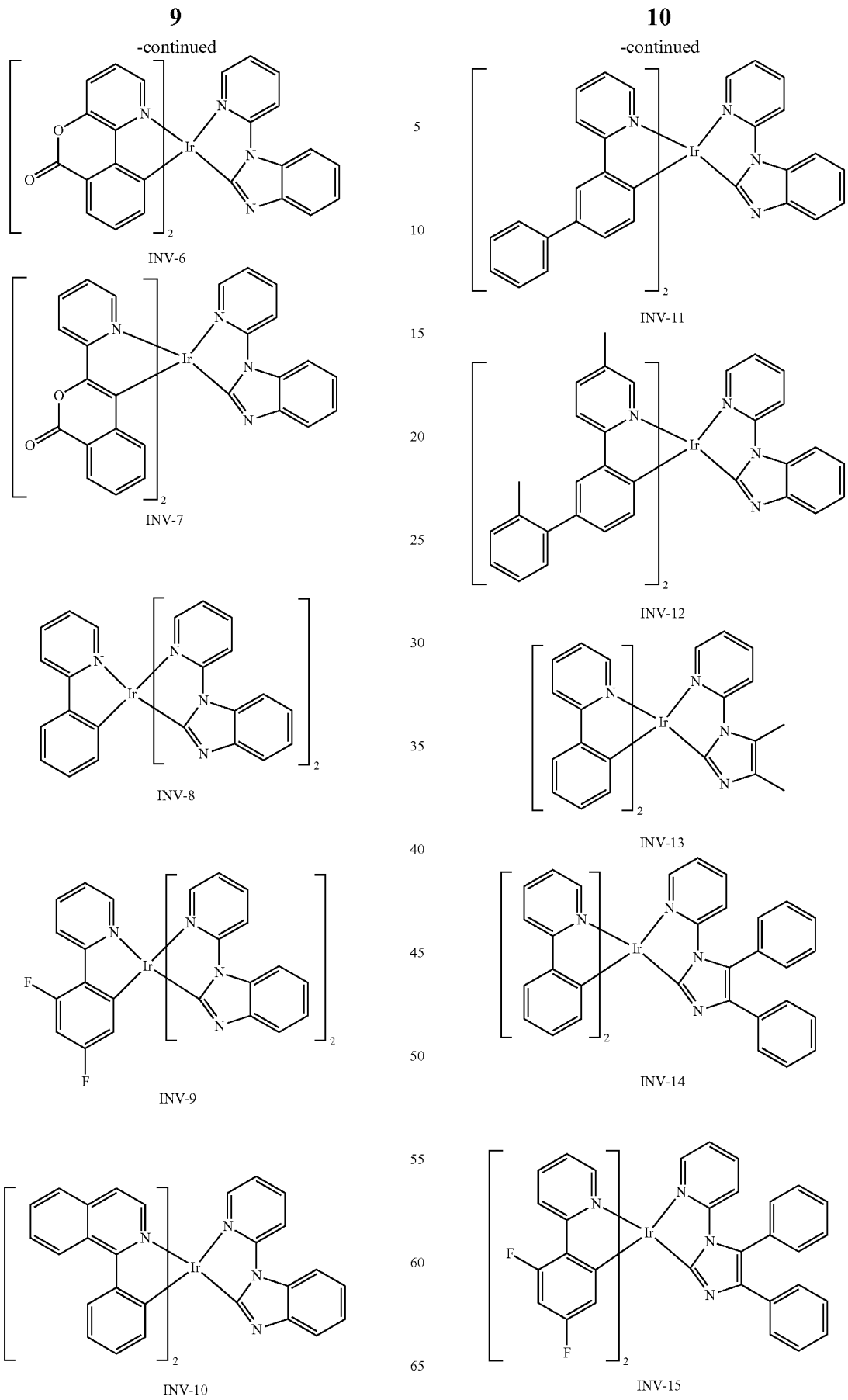

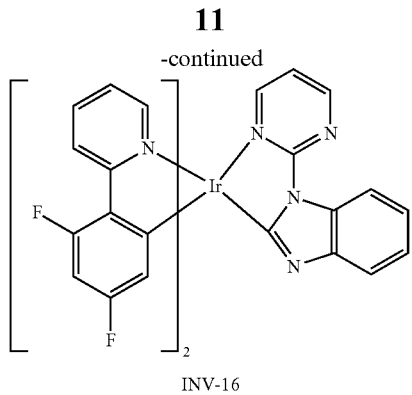

INV-16

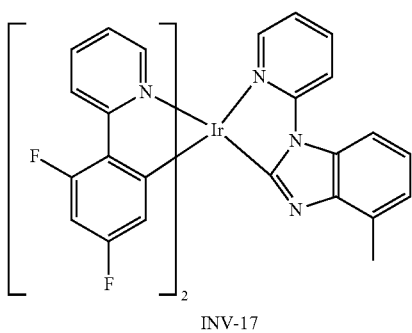

INV-17

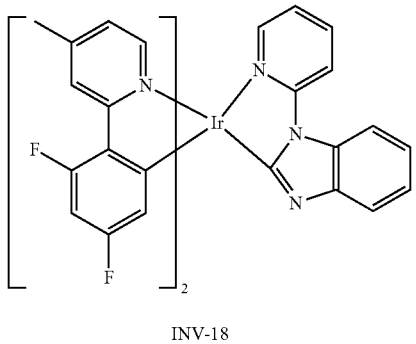

INV-18

Desirable complexes of this invention exhibit blue light emission. Facial isomers are desirable for improved blue emission. Meridianal isomers typically give a broadened and red-shifted emission relative to that of the corresponding facial isomer (A. B. Tamayo, et al., J. Am. Chem. Soc., 125, 7377, 2003). Facial isomers are generally preferred over meridianal isomers because the latter typically give lower phosphorescent quantum yields in addition to the broad and red-shifted emission.

In another embodiment, this invention includes an OLED device including a cathode, an anode, and having therebetween a phosphorescent light-emitting layer that contains a light-emitting homoleptic tris organometallic complex including iridium and three identical C,N-cyclometallating ligands including an imidazole group and a second nitrogen heterocycle group, wherein the organometallic complex has a facial orientation with an emission maximum at a wavelength shorter than 480 nm. The organometallic complex can be a facial iridium complex of compound 4:

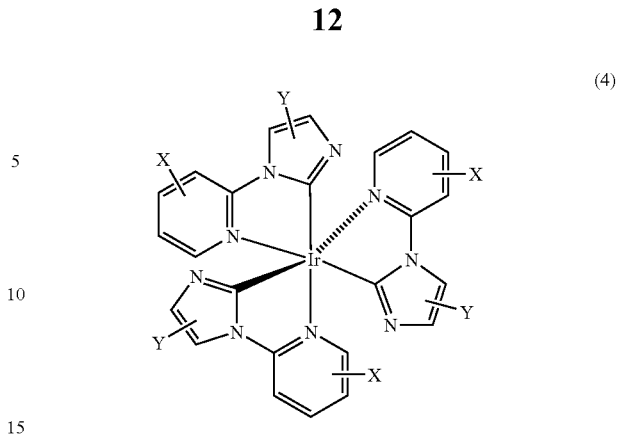

(4)

wherein X and Y represent substituents on one or more of the rings and wherein X or Y or both can be a fused aromatic ring. In one embodiment, Y represents a fused benzene ring, such that the organometallic complex is a facial iridium complex of formula 5:

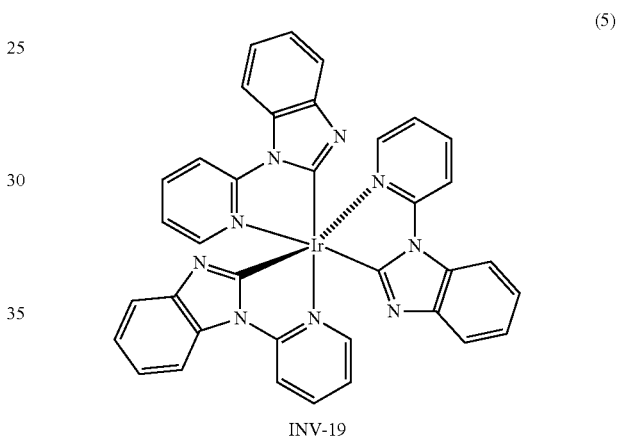

(5)

INV-19

The facial isomer of INV-19 is required for the desired blue emission characteristics. M. Matsuura et al., in JP 2003272861, disclose a compound having the same formula as INV-19 except that the stereochemical isomer (facial or meridianal) is not specified. Matsuura et al. report a green, not blue, electroluminescence from the material. No synthetic procedure is given for how the material was made, and no analytical characterization is provided. Meridianal isomers typically give a broadened and red-shifted emission relative to that of the corresponding facial isomer (above-referenced Tamayo, et al.). Therefore, it is expected that the meridianal isomer would produce a greener emission than the facial isomer, as seen by Matsuura.

Suitably, the phosphorescent light-emitting layer of the OLED device includes a host and one or more dopant compounds disposed in the host material where the dopant(s) is/are present in an amount of up to 15% by weight of the host, and more typically from 0.1-5.0 wt % of the host. At least one dopant is suitably a light-emitting organometallic complex of Formula (1).

Desirable hosts are capable of forming a continuous film and the host is selected so as to have a high level of energy transfer from the host to the dopant material. Examples of desirable hosts useful in this invention are nitrogen heterocyclic host compounds such as 4,4'-N,N'-dicarbazole-biphenyl (CBP), 2,2'-dimethyl-4,4'-N,N'-dicarbazole-biphenyl, 2,2'- bis(1-phenyl-1H-benzimidazol-2-yl)biphenyl, and m-(N,N'-dicarbazole)benzene (mCP). Another class of useful hosts include organic phosphineoxide host compounds disclosed in JP2003 317965A and JP2004 204140A, and by Ren in U.S. Patent Application Publication No. 2006/0269784. Another class of useful hosts includes organosilane host compounds disclosed by Ren et al. in U.S. Patent Application Publication No. 2007/0087219.

Embodiments of the invention can provide advantageous features such as operating efficiency, higher luminance, color hue, low drive voltage, and improved operating stability.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also further substituted derivatives with any substituent group or groups as herein mentioned, so long as the substituent does not destroy properties necessary for utility. Suitably, a substituent group can be halogen or can be bonded to the remainder of the molecule by an atom of carbon, silicon, oxygen, nitrogen, phosphorous, sulfur, selenium, or boron. The substituent can be, for example, halogen, such as chloro, bromo or fluoro; nitro; hydroxyl; cyano; carboxyl; or groups which can be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1(N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which can be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents can themselves be further substituted one or more times with the described substituent groups. The particular substituents used can be selected by those skilled in the art to attain the desired properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected.

Device

The present invention can be employed in most OLED device configurations. These include very simple structures including a single anode and cathode to more complex devices, such as passive matrix displays includes orthogonal arrays of anodes and cathodes to form pixels, and active-matrix displays where each pixel is controlled independently, for example, with thin film transistors (TFTs).

A typical structure, especially useful for of a small molecule device, is shown in FIG. 1 and includes a substrate 101, an anode 103, a hole-injecting layer 105, a hole-transporting layer 107, a light-emitting layer 109, an electron-transporting layer 111, and a cathode 113. These layers are described in detail below. Note that the substrate can alternatively be located adjacent to the cathode, or the substrate can actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure including multiple layers of materials. This is typically the case for active matrix substrates wherein TFTs are provided below the OLED layers. It is still necessary that the substrate, at least in the emissive pixilated areas, include largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate can be a complex structure including multiple layers of materials such as found in active matrix TFT designs. It is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable process such as evaporation, sputtering, chemical vapor deposition, or electrochemical deposition. Anodes can be patterned using well-known photolithographic processes. Optionally, anodes can be polished prior to application of other layers to reduce surface roughness so as to minimize shorts or enhance reflectivity.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals or including at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

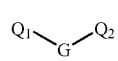

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

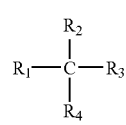

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

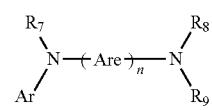

D wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N '-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) of the organic EL element in general includes a luminescent fluorescent or phosphorescent material where electroluminescence is produced as a result of electron-hole pair recombination in this region. The OLED device of this invention includes a phosphorescent light-emitting organometallic complex as described above. However, an OLED device of this invention can include more than one light-emitting layer as known in the art. The light-emitting layers can be fluorescent or phosphorescent layers as known in the art, providing that at least one of the light-emitting layers includes an organometallic complex as described above. A light-emitting layer can include a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters it is also important that the host triplet energy level of the host be high enough to enable energy transfer from host to emitting material.

Host and emitting materials known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

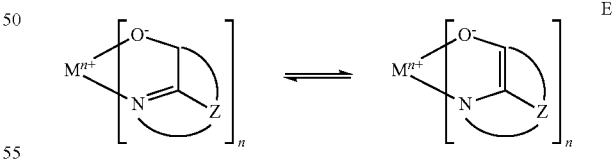

wherein
  M represents a metal;
  n is an integer of from 1 to 4; and
  Z independently in each occurrence represents the atoms completing a nucleus having at least two fused aromatic rings.

The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato)aluminum(III)

CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Benzazole derivatives (Formula G) constitute another class of useful host materials capable of supporting electroluminescence, and are particularly suitable for light emission of wavelengths longer than 400 nm, e.g., blue, green, yellow, orange or red.

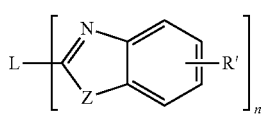

G

Where:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Distyrylarylene derivatives are also useful hosts, as described in U.S. Pat. No. 5,121,029. Carbazole derivatives are particularly useful hosts for phosphorescent emitters. Other useful classes of host materials include organic phosphineoxide host compounds disclosed by Ren in U.S. Patent Application Publication No. 2006/0269784 and organosilane host compounds disclosed by Ren et al. in U.S. Patent Application Publication No. 2007/0087219.

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

In addition to suitable hosts, an OLED device employing a phosphorescent material often requires at least one exciton, electron, or hole blocking layer to help confine the excitons, electrons, or electron-hole recombination centers to the light-emitting layer including the host and phosphorescent material. In one embodiment, such a blocking layer would be placed between electron-transporting layer 111 and light-emitting layer 109. In this case, the ionization potential of the blocking layer should be such that there is an energy barrier for hole migration from the host into the electron-transporting layer, while the electron affinity should be such that electrons pass more readily from the electron-transporting layer into the light-emitting layer including host and phosphorescent material. It is further desired, but not absolutely required, that the triplet energy of the blocking material be greater than that of the phosphorescent material. Suitable hole-blocking materials are described in U.S. Patent Application Publication Nos. 2002/0015859; 2003/0068528; 2003/0175553 and WO 00/70655; WO 01/93642. Two examples of useful materials are bathocuproine (BCP) and bis(2-methyl-8-quinolinolato) (4-phenylphenolato)Aluminum(III) (BAlQ). Metal complexes other than BAlQ are also known to block holes and excitons as described in U.S. Patent Application Publication No. 2003/0068528. U.S. Patent Application Publication No. 2003/0175553 describes the use of fac-tris(1-phenylpyrazolato-N,C$^{2'}$)iridium(III) (Irppz) in an electron/exciton blocking layer. Another useful electron/exciton blocking material is 4,4',4"-tris-(N-carbazolyl)triphenylamine (TCTA). Other useful classes of hole-blocking materials include organic phosphineoxide host compounds disclosed by Ren in U.S. Patent Application Publication No. 2006/0269784 and organosilane host compounds disclosed by Ren et al. in U.S. Patent Application Publication No. 2007/0087219.

Cathode

When light emission is viewed solely through the anode, the cathode used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material includes a Mg:Ag alloy wherein the percentage of silver is in the range of 1 to 20%, as described in U.S. Pat. No. 4,885,221. Another suitable class of cathode materials includes bilayers including the cathode and a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,3936 and EP 1 076 368 and JP 3,234,963. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation. Additionally, a single layer can function to block holes or excitons, and also support electron transportation. It also known in the art that emitting materials can be included in the hole-transporting layer, which can serve as a host. Multiple materials can be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Patent Application Publication No. 2002/0025419, EP 1 182 244, U.S. Pat. Nos. 5,683,823; 5,503,910; 5,405,709 and 5,283,182 and can be equipped with a suitable filter arrangement to produce a color emission.

This invention can be used in so-called stacked device architecture, for example, as taught in U.S. Pat. Nos. 5,703, 436 and 6,337,492.

Deposition of Organic Layers

The organic materials mentioned above are suitably deposited by any process suitable for the form of the organic materials. In the case of small molecules, they are conveniently deposited through sublimation, but can be deposited by other processes such as from a solvent with an optional binder to improve film formation. If the material is a polymer, solvent deposition is usually preferred. The material to be deposited by sublimation can be vaporized from a sublimator "boat" often includes a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the cover or as part of the cover.

Synthesis of the emitting materials useful in the invention can be accomplished by preparing the organic ligand and then using a metal to complex the ligand and form the organometallic compound. The synthesis of ligands useful in the invention can be accomplished by various methods found in the literature.

SYNTHETIC EXAMPLE 1

Preparation of Inv-1

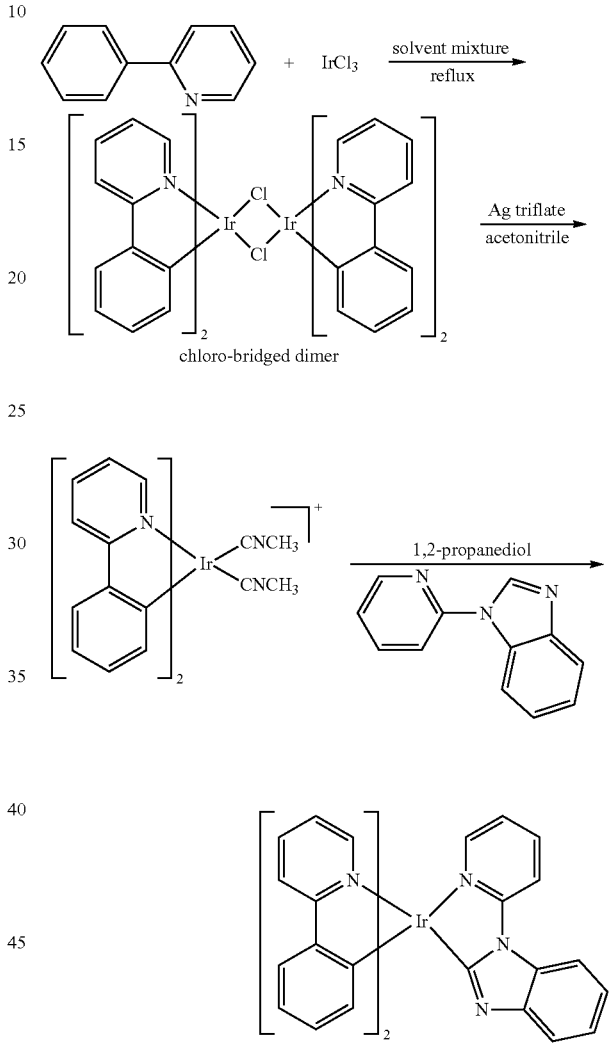

The cyclometalated Ir(III) μ-chloro-bridged dimer was prepared by refluxing $IrCl_3 \cdot nH_2O$ with 2.2 equiv. of 2-phenylpyridine (ppy) in a 3:1 mixture of 2-ethoxyethanol and water for 12 hours. The precipitate was collected by filtration and washed with water, a small amount of methanol, and ether. It was then dried in a warm vacuum oven.

The chloro-bridged dimer complex (1 g) and silver triflate (0.5 g) were placed in a 100 ml round bottomed flask with 20 ml of acetonitrile and the mixture was degassed, and then refluxed for 4 hours under a nitrogen atmosphere. After cooling, the yellow solution was filtered to remove insoluble material. The solvent was removed under vacuum and the intermediate bis(acetonitrile)bis[(2-phenylpyridinato-N, $C^{2'}$)]iridium(III) triflate was recovered.

Figure 2:
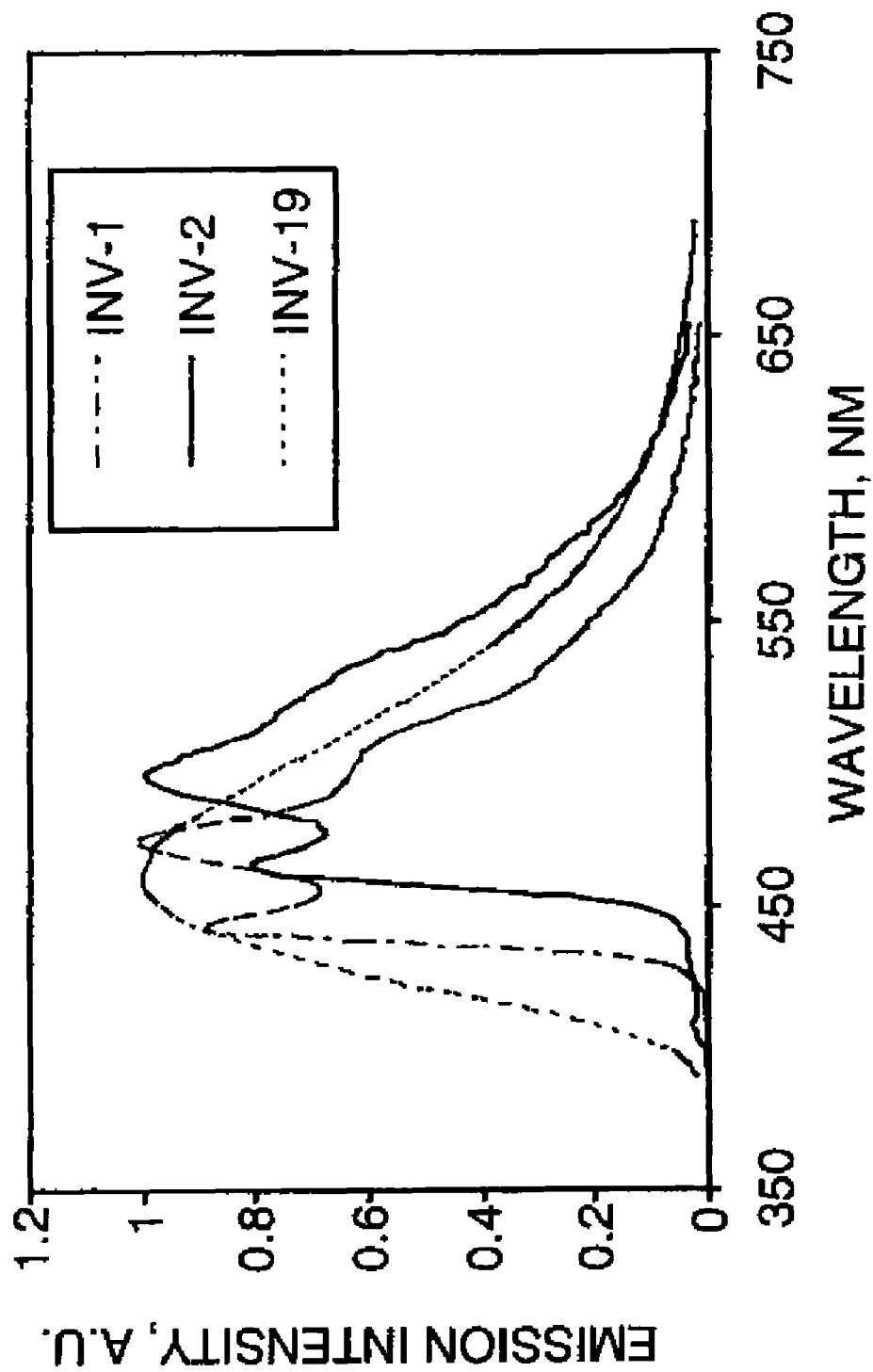
FIG. 2 a comparison of some organometallic complexes useful in this invention.

Bis(acetonitrile)bis[(ppy)]iridium(III) triflate and 1-(2-pyridinyl)-1H-benzimidazole (2.5 equiv, prepared according to the method in *J. Org. Chem.*, 71(21), 8324-7, 2006) were placed in a 100 ml round bottomed flask with 35 ml of 1,2- propanediol. The mixture was degassed, and then refluxed for 12 hours under nitrogen atmosphere. After cooling, the precipitate was collected by filtration, washed with ethanol, redissolved in dichloromethane, and then chromatographed with dichloromethane plus 5% methanol. MS: m/z calcd 695; found 696 [M+1]. HPLC indicated about 96% purity. Further purification was carried out by sublimation. Single-crystal X-ray analysis revealed that INV-1 as prepared herein has a facial configuration. The compound gave a blue emission in solution (see FIG. 2).

SYNTHETIC EXAMPLE 2

Preparation of Inv-2

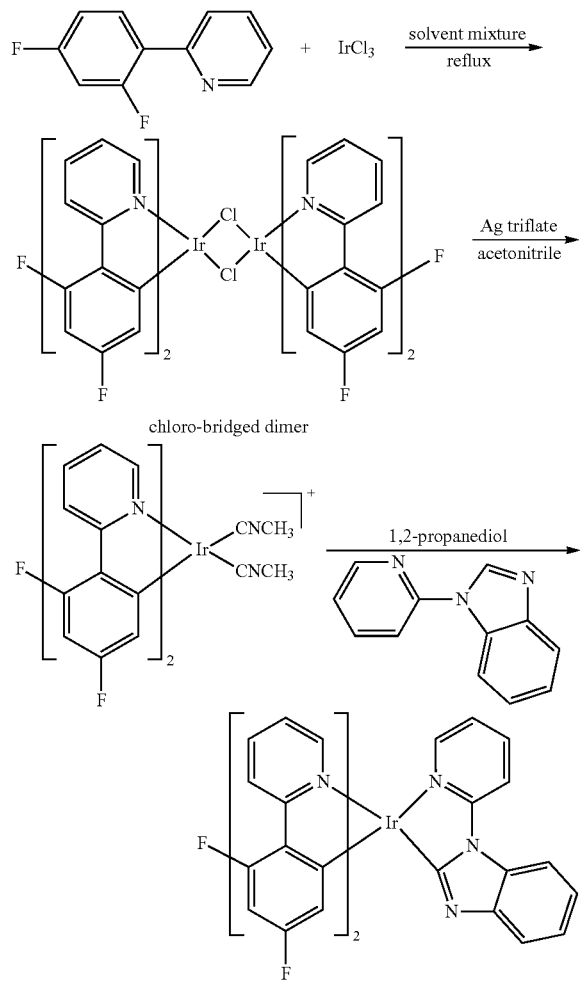

The cyclometalated Ir(III) μ-chloro-bridged dimer was prepared by refluxing $IrCl_3 \cdot nH_2O$ with 2.2 equiv. of 2-(1,4-difluorophenyl)pyridine (dfppy) in a 3:1 mixture of 2-ethoxyethanol and water for 12 hours. The precipitate was collected by filtration and washed with water, a small amount of methanol, and ether. It was then dried in a warm vacuum oven.

The chloro-bridged dimer complex (1.14 g) and silver triflate (0.5 g) were placed in a 100 ml round bottomed flask with 20 ml of acetonitrile. The mixture was degassed, and then refluxed for 4 hours under a nitrogen atmosphere. After cooling, the yellow solution was filtered to remove insoluble material and the solvent was removed under vacuum, leaving the intermediate bis(acetonitrile)bis[((4',6'-difluorophenyl)pyridine-N,$C^{2'}$)]iridium(III) triflate.

Bis(acetonitrile)bis[(dfppy)]iridium(III) triflate and 1-(2-pyridinyl)-1H-benzimidazole (2.5 equiv) were placed in a 100 ml round bottomed flask with 35 ml of 1,2-propanediol and the mixture was degassed, and then refluxed for 12 hours under nitrogen atmosphere. After cooling, the precipitate was collected by filtration, washed with water, redissolved in dichloromethane, and then chromatographed with dichloromethane plus 2.5% methanol. MS: m/z calcd 767; found 768 [M+1]. HPLC indicated about 90% purity. Further purification was carried out by sublimation. The compound gave a blue emission in solution (see FIG. 2).

SYNTHETIC EXAMPLE 3

Preparation of Inv-19

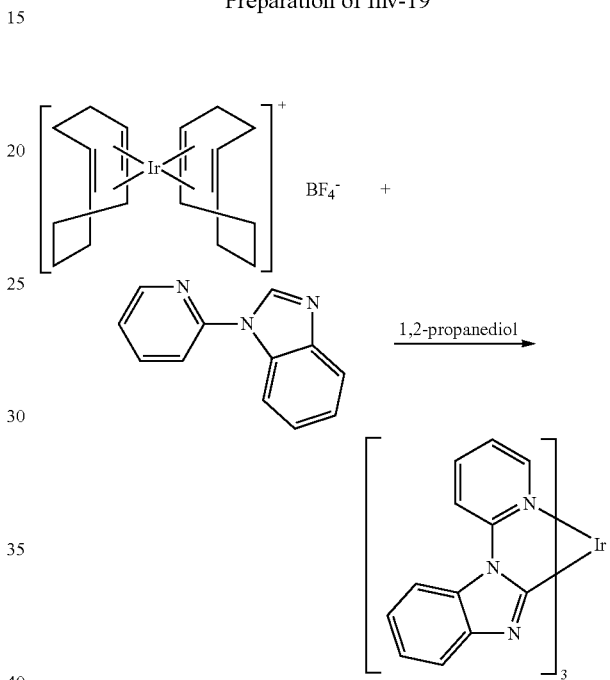

Figure 3:
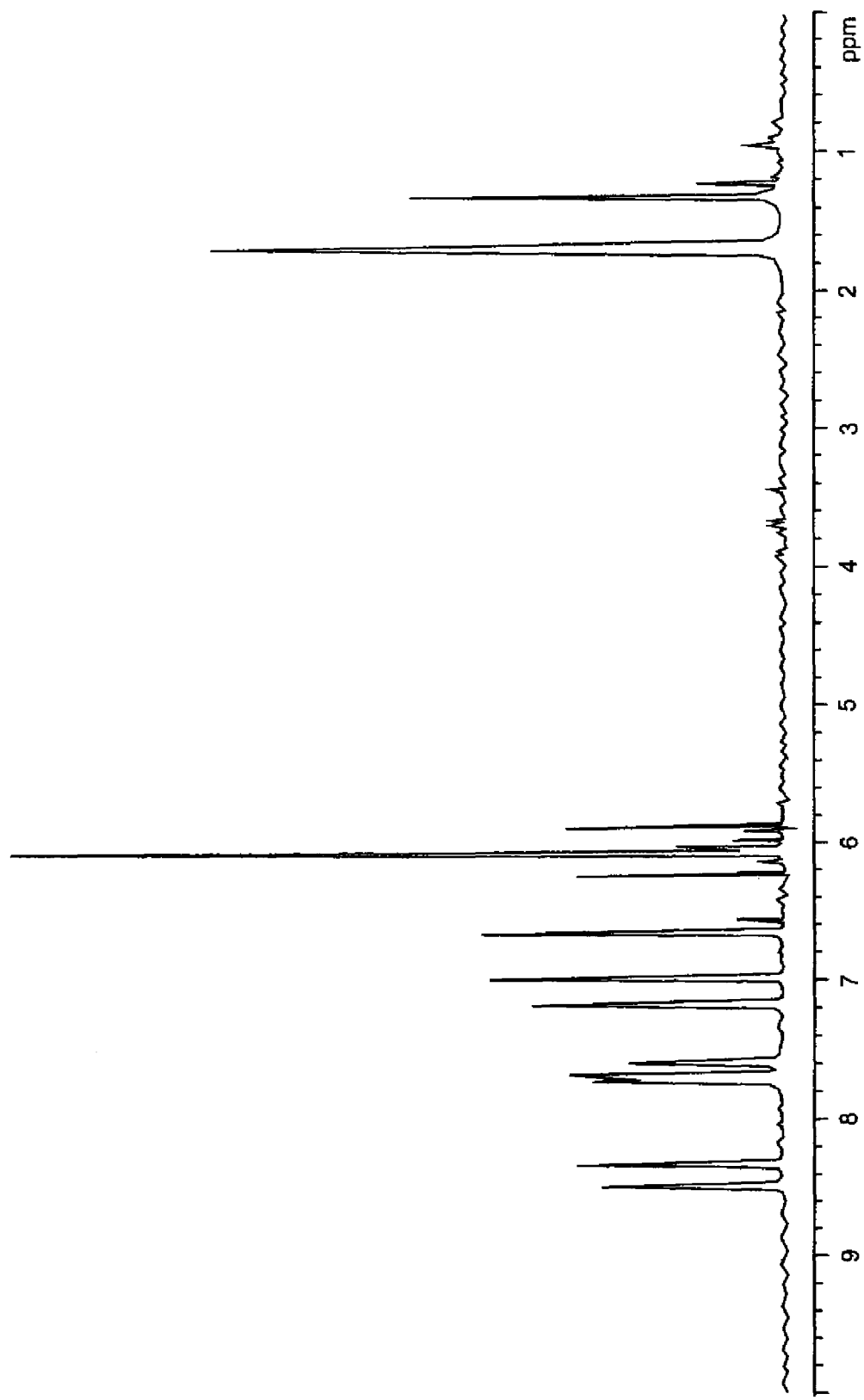
FIG. 3 shows an NMR spectrum of a facial tris homoleptic organometallic complex useful in this invention.

Bis(1,5-cyclooctadiene)iridium (I) tetrafluoroborate (0.52 g) and 1-(2-pyridinyl)-1H-benzimidazole (1.1 mL) were taken up in 1,2-propanediol (30 mL) and the mixture freeze/thaw degassed. The mixture was then heated to reflux for 4 hours. The mixture was cooled to room temperature and the off-white precipitate collected and washed with water and dried. The solid was then dissolved in minimal amount of 9:1 dichloromethane and methanol, and the solution was left in the refrigerator for recrystallization. A white powder was subsequently collected. MS: m/z calcd 775; found 776 [M+1]. $^1$H NMR (in 1,1,2,2-tetrachloroethane-$d_2$): 6.70 (1H, d), 7.03 (1H, dd), 7.20 (1H, dd), 7.62 (1H, dd), 7.73 (1H, d), 7.84 (1H, d), 8.36 (1H, d), 8.50 (1H, dd). The NMR spectrum is shown in FIG. 3. The simple NMR spectrum shows that all three ligands in the complex are equivalent (related by symmetry), thus proving that the compound obtained is the facial isomer, not the meridianal isomer. The compound gave a blue emission in DMSO solution (see FIG. 2). INV-19 is clearly the facial isomer of the chemical formula shown.

The invention and its advantages can be better appreciated by the following examples.

DEVICE EXAMPLES 1-1 to 1-3

A series of EL devices satisfying the requirements of the invention was constructed in the following manner:
1. OLED devices were fabricated on ~1.1-mm-thick glass substrates precoated with a transparent indium-tin oxide (ITO) conductive layer having a thickness of ~22 nm and a sheet resistance of ~70 Ω/square. The substrates were cleaned and dried using a commercial glass scrubber tool, and were then treated with oxygen plasma.
2. Over the ITO was deposited a 1 nm fluorocarbon (CFx) hole-injecting layer (HIL) by plasma-assisted deposition of CHF$_3$.
3. A hole-transporting layer (HTL) of N,N'-di-1-naphthyl-N,N'-diphenyl-4,4'-diaminobiphenyl (NPB) having a thickness of 90 nm was then evaporated from a tantalum boat.
4. A 10 nm electron-blocking layer (EBL) of 4,4',4''-tris-(N-carbazolyl)triphenylamine (TCTA) was then deposited onto the hole-transporting layer by evaporation from a tantalum boat.
5. A 20 nm light-emitting layer (LEL) of m-bis(N-carbazole)benzene (mCP) and Inv-2 was then deposited onto the electron-blocking layer. These materials were also evaporated from tantalum boats. The weight % of Inv-2 was from 6% to 10%, as shown in Table 1, below.
6. A hole-blocking layer of 2,9-dimethyl-4,7-diphenyl-1,10-phenanthroline (BCP) having a thickness of 40 nm was then evaporated from a tantalum boat.
7. A 0.5 nm lithium fluoride (LiF) electron-injecting layer was deposited over the hole-blocking layer.
8. On top of the LiF layer was deposited a 150 nm aluminum cathode.

The device was then hermetically packaged in a dry glove box for protection against ambient environment.

TABLE 1

Evaluation Results for EL devices 1-1 to 1-3.

| Device | Phosphorescent emitter Wt. % | Voltage, V | External quantum Yield, % | Power efficiency, lm/W | CIEx | CIEy |
|---|---|---|---|---|---|---|
| 1-1 | 6 | 7.36 | 1.44 | 1.05 | 0.1493 | 0.2500 |
| 1-2 | 8 | 6.90 | 1.84 | 1.42 | 0.1484 | 0.2488 |
| 1-3 | 10 | 7.34 | 2.19 | 1.59 | 0.1482 | 0.2491 |

DEVICE EXAMPLES 2-1 to 2-4

A series of EL devices satisfying the requirements of the invention was constructed in the following manner:
1. OLED devices were fabricated on ~1.1-mm-thick glass substrates precoated with a transparent indium-tin oxide (ITO) conductive layer having a thickness of ~22 nm and a sheet resistance of ~70 Ω/square. The substrates were cleaned and dried using a commercial glass scrubber tool, and were then treated with oxygen plasma.
2. Over the ITO was deposited a 1 nm fluorocarbon (CFx) hole-injecting layer (HIL) by plasma-assisted deposition of CHF$_3$.
3. A hole-transporting layer (HTL) of NPB having a thickness of 75 nm was then evaporated from a tantalum boat.
4. A 10 nm electron-blocking layer (EBL) of TCTA was then deposited onto the hole-transporting layer by evaporation from a tantalum boat.
5. A 35 nm light-emitting layer (LEL) of mCP and 2,2'-bis(1-phenyl-1H-benzimidazol-2-yl)biphenyl (PBB) with 10% Inv-2 was then deposited onto the electron-blocking layer. These materials were also evaporated from tantalum boats. The weight % of mCP was from 0% to 45%, as shown in Table 2, below.
6. A 10 nm electron-transporting layer (ETL) of PBB was then deposited onto the light-emitting layer. This material was also evaporated from a tantalum boat.
7. A hole-blocking layer of BCP having a thickness of 25 nm was then evaporated from a tantalum boat.
8. A 0.5 nm lithium fluoride (LiF) electron-injecting layer of was deposited over the hole-blocking layer.
9. On top of the LiF layer was deposited a 1000 nm aluminum cathode.

The device was then hermetically packaged in a dry glove box for protection against ambient environment.

TABLE 2

Evaluation Results for EL devices 2-1 to 2-4.

| Device | mCP Wt. % | Voltage, V | External quantum Yield, % | Power efficiency, lm/W | CIEx | CIEy |
|---|---|---|---|---|---|---|
| 2-1 | 0 | 8.64 | 7.27 | 4.36 | 0.1440 | 0.2376 |
| 2-2 | 15 | 7.26 | 7.39 | 5.20 | 0.1434 | 0.2333 |
| 2-3 | 30 | 6.49 | 7.92 | 6.22 | 0.1435 | 0.2337 |
| 2-4 | 45 | 6.22 | 8.76 | 7.27 | 0.1434 | 0.2368 |

DEVICE EXAMPLES 3-1 to 3-4

A series of EL devices satisfying the requirements of the invention was constructed as described above for Examples 2-1 to 2-4, except that Steps 5 and 6 were as follows:
5. A 35 nm light-emitting layer (LEL) of mCP and 2,6-pyridylbis(diphenylphosphineoxide) (PDP) with 10% Inv-2 were then deposited onto the electron-blocking layer. These materials were also evaporated from tantalum boats. The weight % of mCP was from 0% to 45%, as shown in Table 3, below.
6. A 10 nm electron-transporting layer (ETL) of PDP was then deposited onto the light-emitting layer. This material was also evaporated from a tantalum boat.

TABLE 3

Evaluation Results for EL devices 3-1 to 3-4.

| Device | mCP Wt. % | Voltage, V | External quantum Yield, % | Power efficiency, lm/W | CIEx | CIEy |
|---|---|---|---|---|---|---|
| 3-1 | 0 | 8.48 | 1.64 | 1.03 | 0.1529 | 0.2453 |
| 3-2 | 15 | 7.93 | 3.54 | 2.54 | 0.1531 | 0.2704 |
| 3-3 | 30 | 6.86 | 4.12 | 4.45 | 0.1545 | 0.2743 |
| 3-4 | 45 | 6.37 | 3.94 | 3.55 | 0.1550 | 0.2743 |

DEVICE EXAMPLES 4-1 to 4-5

A series of EL devices satisfying the requirements of the invention was constructed as described above for Examples 2-1 to 2-4, except that Steps 5 and 6 were as follows:
5. A 35 nm light-emitting layer (LEL) of mCP and bis(4-dimesitylboronphenyl)diphenylsilane (MBPS) with 10% Inv-2 was then deposited onto the electron-blocking layer. These materials were also evaporated from tantalum boats. The weight % of mCP was from 0% to 60%, as shown in Table 4, below.
6. A 10 nm electron-transporting layer (ETL) of MBPS was then deposited onto the light-emitting layer. This material was also evaporated from a tantalum boat.

TABLE 4

Evaluation Results for EL devices 4-1 to 4-4.

| Device | mCP Wt. % | Voltage, V | External quantum Yield, % | Power efficiency, lm/W | CIEx | CIEy |
|---|---|---|---|---|---|---|
| 4-1 | 0 | 11.8 | 0.83 | 0.43 | 0.1733 | 0.3016 |
| 4-2 | 15 | 8.29 | 4.17 | 2.88 | 0.1539 | 0.2719 |
| 4-3 | 30 | 7.37 | 4.93 | 3.87 | 0.1563 | 0.2751 |
| 4-4 | 45 | 7.07 | 5.07 | 4.16 | 0.1578 | 0.2770 |
| 4-5 | 60 | 6.51 | 6.83 | 6.07 | 0.1572 | 0.2747 |

Figure 4:
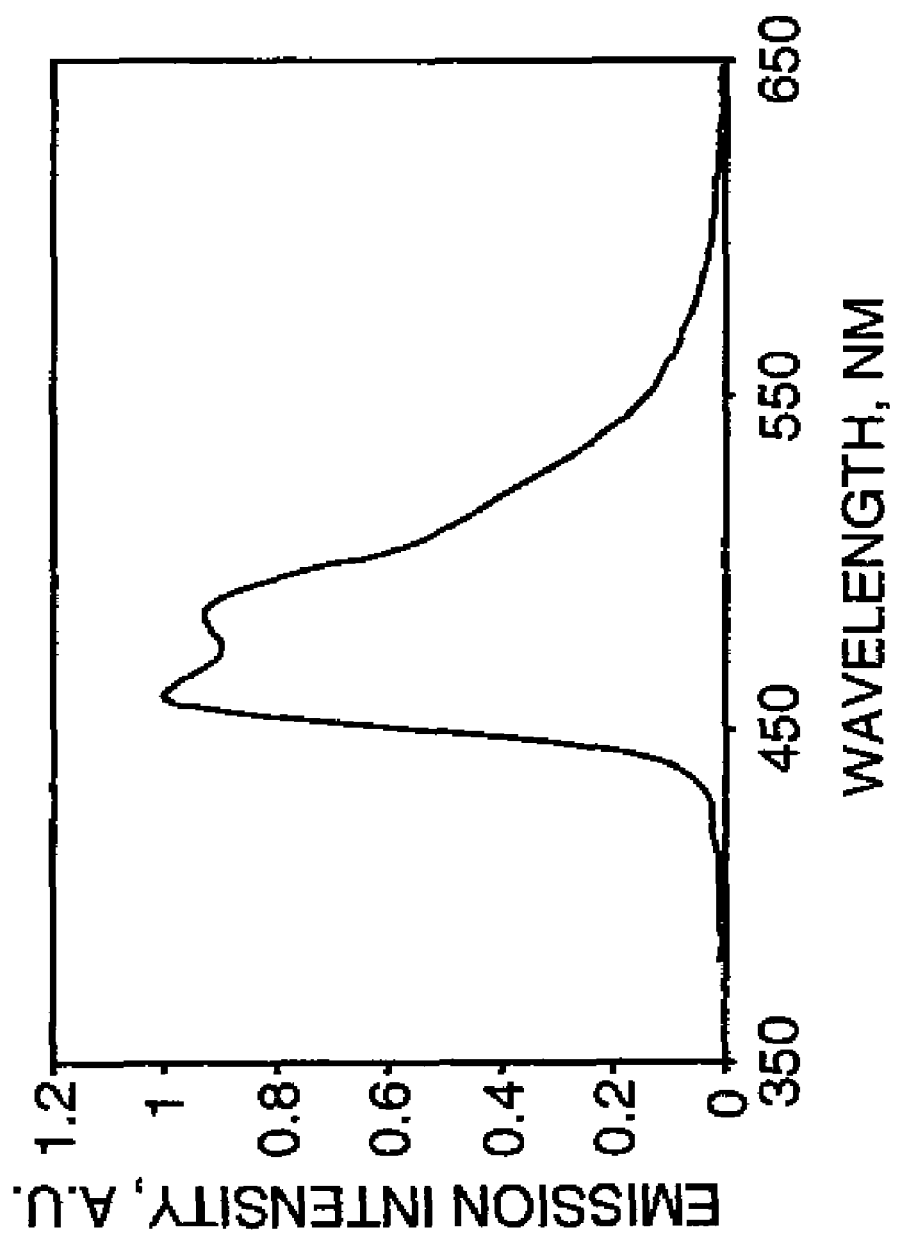
FIG. 4 shows an emission spectrum for an OLED device of this invention.

As can be seen from the results in the above tables, OLED devices of this invention including a mixed-ligand organometallic complex as described herein can provide blue emission with good voltage requirements. Some of the devices also have very good quantum yields and power efficiency, in particular devices 2-1 to 2-4 and 4-4 to 4-5. FIG. 4 shows the EL spectrum characteristics of device 2-4. This device demonstrates a rare example of highly efficient tris-(C^N) cyclometalated Ir(II)-based OLEDs with "deep blue" emission.

The invention has been described in detail with particular reference to certain preferred embodiments thereof, but it will be understood that variations and modifications can be effected within the spirit and scope of the invention.

PARTS LIST

| | |
|---|---|
| 101 | Substrate |
| 103 | Anode |
| 105 | Hole-Injecting layer (HIL) |
| 107 | Hole-Transporting layer (HTL) |
| 109 | Light-Emitting layer (LEL) |
| 111 | Electron-Transporting layer (ETL) |
| 113 | Cathode |

The invention claimed is:

1. An OLED device comprising a cathode, an anode, and having therebetween a phosphorescent light-emitting layer that contains a light-emitting organometallic complex represented by Formula 2:

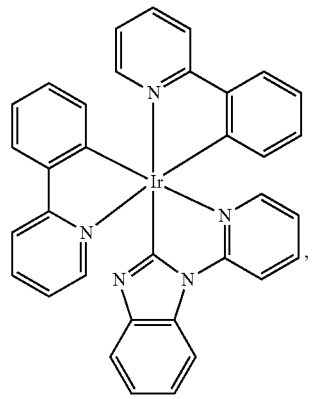

(2)

wherein the device emits blue light.

2. The OLED device of claim 1 wherein the light-emitting organometallic complex is a dopant compound disposed in a host material.

3. The OLED device of claim 2 wherein the dopant compound is present in an amount of up to 15% by weight based on the host material.

4. The OLED device of claim 2 wherein the host material includes a nitrogen heterocyclic host compound.

5. The OLED device of claim 2 wherein the host material includes an organic phosphineoxide host compound.

6. The OLED device of claim 2 wherein the host material includes an organosilane host compound.

7. An OLED device comprising a cathode, an anode, and having therebetween a phosphorescent light-emitting layer that contains a light-emitting organometallic complex represented by Formula 3:

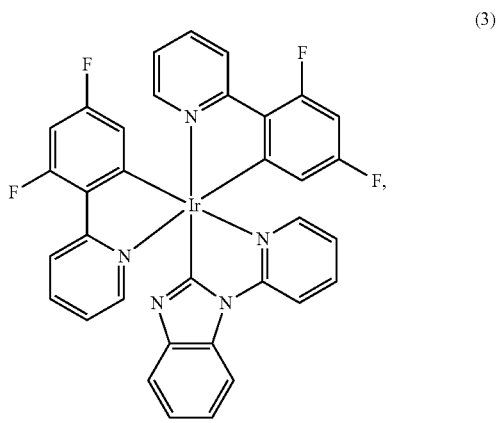

(3)

wherein the device emits blue light.

8. The OLED device of claim 7 wherein the light-emitting organometallic complex is a dopant compound disposed in a host material.

9. The OLED device of claim 8 wherein the dopant compound is present in an amount of up to 15% by weight based on the host material.

10. The OLED device of claim 8 wherein the host material includes a nitrogen heterocyclic host compound.

11. The OLED device of claim 8 wherein the host material includes an organic phosphineoxide host compound.

12. The OLED device of claim 8 wherein the host material includes an organosilane host compound.

* * * * *